United States Patent
Utsunomiya et al.

(10) Patent No.: US 10,794,770 B2
(45) Date of Patent: Oct. 6, 2020

(54) SIGNAL DETECTION CIRCUIT AND SIGNAL DETECTION METHOD

(71) Applicants: ABLIC INC., Chiba-shi, Chiba (JP); The Ritsumeikan Trust, Kyoto-shi, Kyoto (JP)

(72) Inventors: Fumiyasu Utsunomiya, Chiba (JP); Takakuni Douseki, Kusatsu (JP); Ami Tanaka, Kusatsu (JP)

(73) Assignees: ABLIC INC., Chiba (JP); THE RITSUMEIKAN TRUST, Kyoto (JP)

( * ) Notice: Subject to any disclaimer, the term of this patent is extended or adjusted under 35 U.S.C. 154(b) by 48 days.

(21) Appl. No.: 16/277,215

(22) Filed: Feb. 15, 2019

(65) Prior Publication Data
US 2019/0257694 A1  Aug. 22, 2019

(30) Foreign Application Priority Data
Feb. 19, 2018  (JP) .................... 2018-027116

(51) Int. Cl.
| | |
|---|---|
| H03F 3/08 | (2006.01) |
| G05F 3/16 | (2006.01) |
| G01J 5/34 | (2006.01) |
| G01R 19/00 | (2006.01) |
| H03K 19/0944 | (2006.01) |

(52) U.S. Cl.
CPC ........... *G01J 5/34* (2013.01); *G01R 19/00* (2013.01); *G05F 3/16* (2013.01); *H03F 3/082* (2013.01); *H03K 19/0944* (2013.01)

(58) Field of Classification Search
CPC ... G01J 5/34; G01R 19/00; G05F 3/16; H03F 3/082; H03K 19/0944

USPC ...................................................... 250/338.3
See application file for complete search history.

(56) References Cited

U.S. PATENT DOCUMENTS

| | | | | |
|---|---|---|---|---|
| 5,523,723 A | * | 6/1996 | Arcus ............... | H03K 3/0231 331/17 |
| 2003/0053273 A1 | * | 3/2003 | Utsunomiya ....... | H03K 17/223 361/91.1 |
| 2005/0285040 A1 | * | 12/2005 | Fukui ............... | G01J 5/34 250/338.3 |
| 2011/0109364 A1 | * | 5/2011 | Yamasaki ......... | H03K 19/00384 327/206 |
| 2011/0155913 A1 | * | 6/2011 | Noguchi ........... | G01J 5/0022 250/338.3 |
| 2014/0339399 A1 | * | 11/2014 | Sanson ............. | H03F 3/087 250/214 A |

(Continued)

FOREIGN PATENT DOCUMENTS

JP    2015-049043 A    3/2015

*Primary Examiner* — Taeho Jo
(74) *Attorney, Agent, or Firm* — Brinks Gilson & Lione

(57) ABSTRACT

A signal detection circuit includes: a power terminal; a first current limitation circuit; a second current limitation circuit; a current-voltage conversion circuit; a first p-channel MOS transistor including a source, a gat, and a drain; a first n-channel MOS transistor including a drain, a gate, and a source; and a second n-channel MOS transistor in which a drain is connected to a first connection point connecting the resistor with the drain of the first n-channel MOS transistor, a gate is connected to a second connection point connecting the drain of the first p-channel MOS transistor with the current-voltage conversion circuit, and a source is grounded.

10 Claims, 5 Drawing Sheets

(56) References Cited

U.S. PATENT DOCUMENTS

| | | | |
|---|---|---|---|
| 2015/0060671 A1* | 3/2015 | Utsunomiya | G01J 5/34 |
| | | | 250/338.3 |
| 2015/0263211 A1* | 9/2015 | Okada | H03F 3/08 |
| | | | 250/214 A |
| 2016/0211814 A1* | 7/2016 | Lin | H03F 3/217 |
| 2017/0328776 A1* | 11/2017 | Shimasaki | G01J 1/0407 |
| 2018/0083419 A1* | 3/2018 | Lee | H01S 5/0261 |

\* cited by examiner

SIGNAL DETECTION CIRCUIT AND SIGNAL DETECTION METHOD

RELATED APPLICATIONS

This application claims priority to and benefit of Japanese Patent Application No. 2018-27116, filed on Feb. 19, 2018, which is hereby incorporated by reference in its entirety.

BACKGROUND OF THE INVENTION

1. Field of the Invention

The present invention relates to a signal detection circuit and a signal detection method.

2. Description of the Related Art

In the related art, signal detection circuits that detect minute changes in voltages output as measurement results by sensor elements measuring physical quantities have been used.

FIG. 3 shows a configuration of a signal detection circuit that detects a change in a voltage detected by a pyroelectric infrared detection element (hereinafter referred to as a pyroelectric detection element) serving as a sensor element. The pyroelectric detection element is, for example, disclosed in Japanese Unexamined Patent Application Publication No. 2015-49043.

A signal detection circuit 200 detects a minute change between both ends of a pyroelectric detection element 300 according to a charge generated by a pyroelectric element 301 and outputs a detection signal.

In the pyroelectric detection element 300, the pyroelectric element 301 and a resistor 302 are connected in parallel.

The signal detection circuit 200 includes an n-channel MOS transistor 204, a resistor 205, a resistor 206, and a capacitor 207. In the signal detection circuit 200, an output terminal 208 is connected to an input of a comparator 400. An input of the comparator 400 is connected to a connection point P (the output terminal 208) of one end of the resistor 205 and a drain of the n-channel MOS transistor 204.

The pyroelectric detection element 300 detects infrared light, and thus a voltage value of a voltage signal supplied to an input terminal 203 of the signal detection circuit 200 is changed. Here, when an infrared radiation source becomes close to the pyroelectric detection element 300, the voltage value of the voltage signal is changed to a plus (positive) side. Conversely, when the infrared radiation source is away from the pyroelectric detection element 300, the voltage value of the voltage signal is changed to a minus (negative) side.

FIG. 4 is a waveform diagram showing detection of a change in a voltage of the input terminal 203 in the signal detection circuit 200. In all the graphs of FIG. 4, the vertical axis represents a voltage value and the horizontal axis represents a time.

Here, in the n-channel MOS transistor 204, a predetermined bias current flows via the resistor 206. Therefore, a voltage of the connection point P is a voltage VH lowered by a voltage ΔV from a power voltage at a power voltage terminal VDD due to a voltage drop of the resistor 205 in accordance with the predetermined bias current. When the voltage value of the voltage signal of the pyroelectric detection element 300 is raised by $\Delta V_{SIG\_H}$ to the positive-side, a current flowing in the n-channel MOS transistor 204 increases and the increased current is used to charge the capacitor 207.

Therefore, in the n-channel MOS transistor 204, a gate to source voltage is maintained for a predetermined time decided with a drain current and the capacitance of the capacitor 207. Then, in the n-channel MOS transistor 204, the increased drain current flows for a predetermined time. Thus, the voltage value of the connection point P is lowered due to an increase in the voltage of the voltage drop in the resistor 205 since the increased current flows in the resistor 205. Then, a pulse with an "L" level of a time width T corresponding to the maintained time is output from the connection point P. Then, the comparator 400 forms a pulse waveform output from the connection point P and outputs the pulse waveform as an output signal.

Conversely, when the voltage value of the voltage signal of the pyroelectric detection element 300 is lowered by $\Delta V_{SIG\_L}$ to the negative-side, the n-channel MOS transistor 204 enters an OFF state, and thus no current flows. Therefore, the voltage drop of the resistor 205 disappears, and thus the voltage value of the connection point P coincide with the power voltage. However, the signal detection circuit 200 is configured to detect a signal if the voltage value of the voltage signal of the pyroelectric detection element 300 increases. Although the comparator 400 connected with the signal detection circuit 200 forms a waveform and outputs the waveform as an output signal if the voltage of the pulse supplied from the connection point P is lower than a reference voltage value, the comparator 400 does not output an output signal even if a pulse of a voltage which is higher than or equal to the reference voltage, such as the voltage VH or the power voltage, is supplied.

Therefore, when a change in the voltage value of the voltage signal of the pyroelectric detection element 300 on each of the positive-side and the negative-side is desired to be detected, a circuit which includes the signal detection circuit 200 shown in FIG. 3 and a signal detection circuit that detects a change on the negative-side and has a similar configuration to the signal detection circuit 200 is provided.

FIG. 5 is a diagram showing a configuration example of the circuit that detects a change in the voltage value of the voltage signal of the pyroelectric detection element 300 on each of the positive-side and the negative-side.

The circuit shown in FIG. 5 includes a positive-side change detection circuit (hereinafter referred to as "positive-side change detection circuit 200") corresponding to the signal detection circuit 200, a negative-side change detection circuit 250, a comparator 400, a comparator 450, and an OR circuit 550.

The pyroelectric detection element 300 is connected to a terminal 560 and supplies a voltage signal to each of the positive-side change detection circuit 200 and the negative-side change detection circuit 250.

Then, the positive-side change detection circuit 200 outputs a negative pulse (a pulse transitioning to an H level→an L level→the H level) as a detection result when the voltage value of the voltage signal of the pyroelectric detection element 300 is changed to the positive-side, as described above. The comparator 400 shapes the negative pulse from the positive-side change detection circuit 200 and outputs an output signal of a positive pulse (a pulse transitioning to the L level→the H level→the L level).

The negative-side change detection circuit 250 outputs a positive pulse as a detection result when the voltage value of the voltage signal of the pyroelectric detection element 300 is changed on the negative-side, as described above. The comparator 400 shapes the positive pulse supplied from the positive-side change detection circuit 200 and outputs an output signal of the positive pulse.

The OR circuit 500 outputs the positive pulse in each of a first case where the voltage value of the voltage signal of the pyroelectric detection element 300 is changed on the positive-side and a second case where the voltage value of the voltage signal of the pyroelectric detection element 300 is changed on the negative-side.

However, in the circuit shown in FIG. 5, as a configuration for detecting a change in the voltage value of the voltage signal on the positive-side, the positive-side change detection circuit 200 and the comparator 400 are necessary. As a configuration for detecting a change in the voltage value of the voltage signal of the pyroelectric detection element 300 on the negative-side, the negative-side change detection circuit 250 and the comparator 450 are necessary.

Further, the OR circuit 550 is necessary in order to combine output signals of the comparators 400 and 450.

If both the changes in the voltage value of the voltage signal on the positive-side and the negative-side are configured to be detected, a circuit size may increase, as shown in FIG. 5, and thus the current consumption may increase.

SUMMARY OF THE INVENTION

The present invention is devised in view of such circumstances and an object of the present invention is to provide a signal detection circuit and a signal detection method configured to suppress an increase in a circuit size and current consumption and enable a change in a voltage value of a voltage signal on each of a positive-side and a negative-side to be detected.

According to an aspect of the present invention, there is provided a signal detection circuit including: a power terminal; a first current limitation circuit connected to the power terminal; a second current limitation circuit; a current-voltage conversion circuit; a first p-channel MOS transistor including a source connected to the first current limitation circuit, a gate to which a voltage changing in accordance with a change in a voltage level of an input voltage is supplied, and a drain grounded via the current-voltage conversion circuit; a first n-channel MOS transistor including a drain connected to the power terminal via a resistor, a gate to which a voltage changing in accordance with the change in the voltage level of the input voltage is supplied, and a source grounded via the second current limitation circuit; and a second n-channel MOS transistor in which a drain is connected to a first connection point connecting the resistor with the drain of the first n-channel MOS transistor, a gate is connected to a second connection point connecting the drain of the first p-channel MOS transistor with the current-voltage conversion circuit, and a source is grounded.

According to another aspect of the present invention, there is provided a signal detection method, using a signal detection circuit including a power terminal, an input terminal, a first current limitation circuit connected to the power terminal, a second current limitation circuit, a resistor connected to the power terminal, a current-voltage conversion circuit, a first p-channel MOS transistor including a source connected to the power terminal via the first current limitation circuit, a gate to which a voltage changing in accordance with a change in a voltage level of an input voltage is supplied, and a drain grounded via a current-voltage conversion circuit, a first n-channel MOS transistor including a drain connected to the power terminal via the resistor, a gate to which a voltage changing in accordance with the change in the voltage level of the input voltage is supplied, and a source grounded via the second current limitation circuit, and a second n-channel MOS transistor in which a drain is connected to a first connection point connecting the resistor with the drain of the first n-channel MOS transistor, a gate is connected to a second connection point connecting the drain of the first p-channel MOS transistor with the current-voltage conversion circuit, and a source is grounded, comprising of: amplifying a change in a signal voltage supplied from the input terminal to a positive voltage side by the resistor and the first n-channel MOS transistor; and amplifying a change in a signal voltage supplied from the input terminal to a negative voltage side by the resistor and the second n-channel MOS transistor.

According to the present invention, it is possible to provide the signal detection circuit and the signal detection method to suppress an increase in a circuit size and current consumption and enable a change in a voltage value of a voltage signal on each of a positive-side and a negative-side to be detected.

DETAILED DESCRIPTION OF THE PREFERRED EMBODIMENTS

Figure 1:
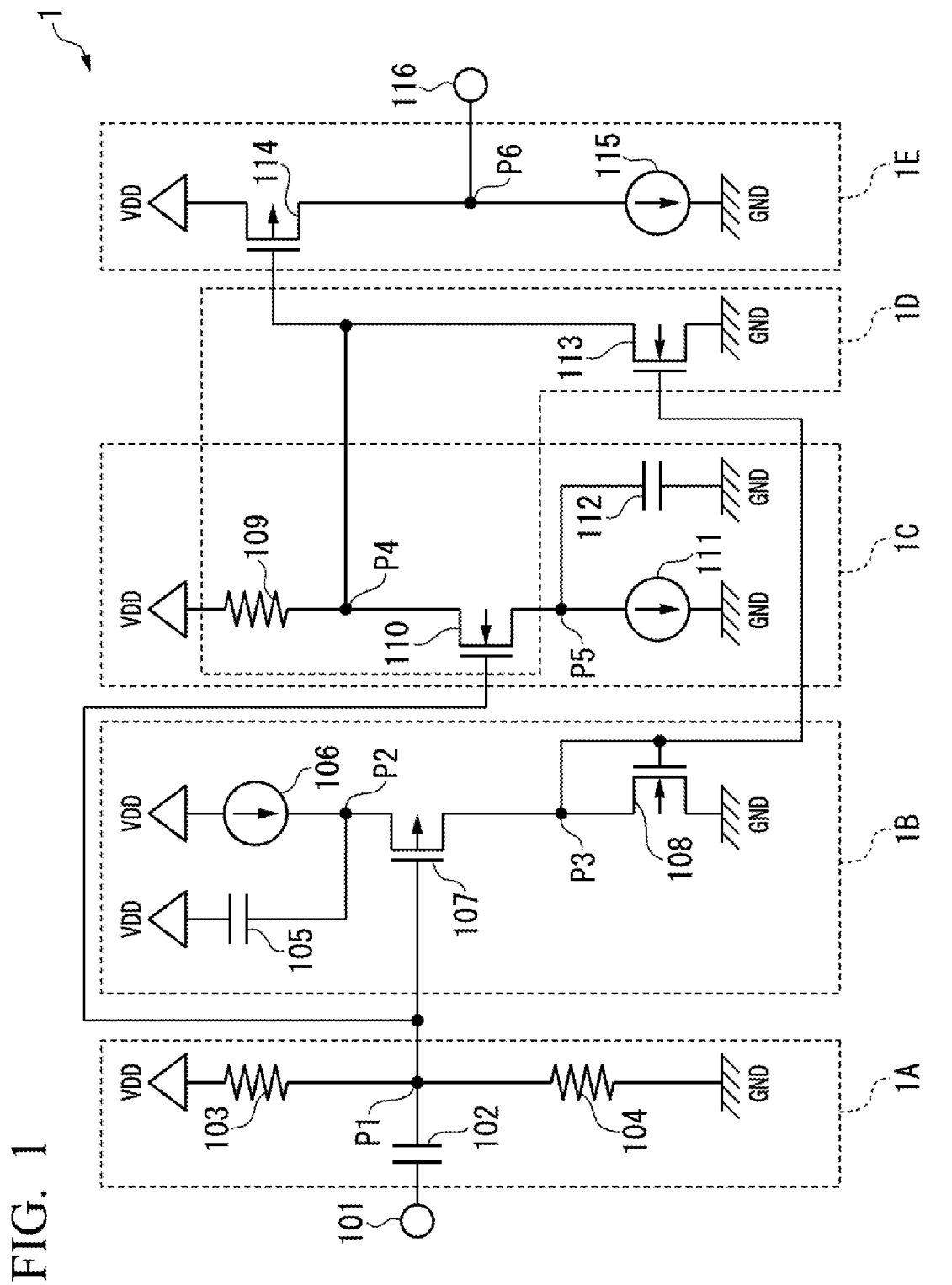
FIG. 1 is a schematic block diagram showing a configuration example of a signal detection circuit according to an embodiment of the present invention.

Hereinafter, an embodiment of the present invention will be described with reference to the drawings. FIG. 1 is a schematic block diagram showing a configuration example of a signal detection circuit according to the embodiment.

In FIG. 1, a signal detection circuit 1 includes a capacitor 102, a resistor 103, a resistor 104, a capacitor 105, a constant current source circuit 106, a p-channel MOS transistor (hereinafter referred to as "pMOS transistor") 107, an n-channel MOS transistor (hereinafter referred to as "nMOS transistor") 108, a resistor 109, an nMOS transistor 110, a constant current source circuit 111, a capacitor 112, an nMOS transistor 113, a pMOS transistor 114, and a constant current source circuit 115.

One end of the resistor 103 is connected to a VDD (power voltage) terminal and the other end of the resistor 103 is connected to one end of the resistor 104 via a connection point P1. The other end of the resistor 104 is connected to a GND (ground) terminal. One end of the capacitor 102 is connected to an input terminal 101 and the other end of the capacitor 102 is connected to the connection point P1. Thus, the capacitor 102, the resistor 103, and the resistor 104 form a bias circuit 1A that has a function of an input circuit. The capacitor 102 is a direct-current blocking capacitor and reflects an amount of change of a voltage value of a voltage signal in a bias voltage.

A source of the pMOS transistor 107 is connected to a connection point P2, a gate of the pMOS transistor 107 is connected to the connection point P1, and a drain of the pMOS transistor 107 is connected to a connection point P3. The capacitor 105 and the constant current source circuit 106 are connected in parallel between the VDD terminal and the connection point P2 and form a first current limitation circuit. That is, the first current limitation circuit includes the constant current source circuit 106 and the capacitor 105 connected in parallel. A drain and a gate of the nMOS transistor 108 are connected to the connection point P3 and a source of the nMOS transistor 108 is connected to the GND terminal. The nMOS transistor 108 constitutes a current-voltage conversion circuit that converts a drain current of the pMOS transistor 107 into a voltage. The current-voltage conversion circuit includes the nMOS transistor 108 in which each of a gate and a drain are connected to the drain of the pMOS transistor 107 and the gate of the nMOS transistor 113, and a source is grounded. Thus, the capacitor 105, the constant current source circuit 106, the pMOS transistor 107, and the nMOS transistor 108 form a negative-side change detection circuit 1B that detects a change in a voltage signal supplied to the input terminal 101, to the negative-side. The constant current source circuit 106 and the nMOS transistor 108 controls a bias current flowing in the pMOS transistor 107 to correspond to the bias voltage output of the bias circuit 1A.

A drain of the nMOS transistor 110 is connected to a connection point P4, a gate of the n-channel MOS transistor 110 is connected to the connection point P1, and a source of the n-channel MOS transistor 110 is connected to a connection point P5. One end of the resistor 109 is connected to the VDD terminal and the other end of the resistor 109 is connected to the connection point P4. The constant current source circuit 111 and the capacitor 112 are connected in parallel between the connection point P5 and the GND terminal and form a second current limitation circuit. That is, the second current limitation circuit includes the second constant current source circuit 111 and the capacitor 112 connected in parallel. The resistor 109, the nMOS transistor 110, the constant current source circuit 111, and the capacitor 112 form a positive-side change detection circuit 1C that detects a change in the voltage signal supplied to the input terminal 101, to the positive-side. The resistor 109 and the nMOS transistor 110 form a source-grounded amplification circuit. The resistor 109 and the constant current source circuit 111 control a bias current flowing in the nMOS transistor 110 to correspond to the bias voltage output of the bias circuit 1A.

In the negative-side change detection circuit 1B, the constant current source circuit 106 adjusts the bias current flowing in the pMOS transistor 107. Further, by providing the capacitor 105, a gate to source voltage (hereinafter referred to as "VGS") of the pMOS transistor 107 is maintained at a voltage value raised due to a change in the voltage value during a time corresponding to the capacitance of the capacitor 105 by using the drain current increasing due to a change in the voltage value of the voltage signal to charge the capacitor 105.

A drain of the nMOS transistor 113 is connected to the connection point P4, a gate of the nMOS transistor 113 is connected to the connection point P3, and a source of the nMOS transistor 113 is connected to the GND terminal.

In the embodiment, the nMOS transistor 113 forms a current mirror circuit along with the nMOS transistor 108 in the negative-side change detection circuit 1B. Thus, in the nMOS transistor 113, an output current at the time of detection of a change in the voltage signal on the negative-side in the negative-side change detection circuit 1B is duplicated and flows.

The nMOS transistor 113 forms a source-grounded amplification circuit by using the resistor 109 in the positive-side change detection circuit 1C. That is, the nMOS transistor 113 forms an NOR (wired NOR) source-grounded amplification circuit 1D by using the resistor 109 which is commonly used by the nMOS transistor 110. Thus, in the embodiment, even if there is a variation in characteristics of the nMOS transistor and the pMOS transistor and a divergence in sensitivity due to a difference in a bias current, a change in the voltage signal supplied from the input terminal 101 on the positive-side and the negative-side can be detected with good accuracy by the source-grounded amplification circuit using the same resistor.

In the positive-side change detection circuit 1C, the constant current source circuit 111 adjusts the bias current flowing in the nMOS transistor 110. Further, by providing the capacitor 112, a VGS of the nMOS transistor 110 is maintained at a voltage value raised due to a change in the voltage value during a time corresponding to the capacitance of the capacitor 112 by using the drain current increasing due to a change in the voltage value of the voltage signal to charge the capacitor 112.

A source of the pMOS transistor 114 is connected to the VDD terminal, a gate of the pMOS transistor 114 is connected to the connection point P4, and a drain of the pMOS transistor 114 is connected to a connection point P6. One end of the constant current source circuit 115 is connected to the connection point P6 and the other end of the constant current source circuit 115 is connected to the GND terminal. The connection point P6 is connected to an output terminal 116. Thus, the pMOS transistor 114 and the constant current source circuit 115 form an output circuit 1E that performs waveform shaping.

Figure 2:
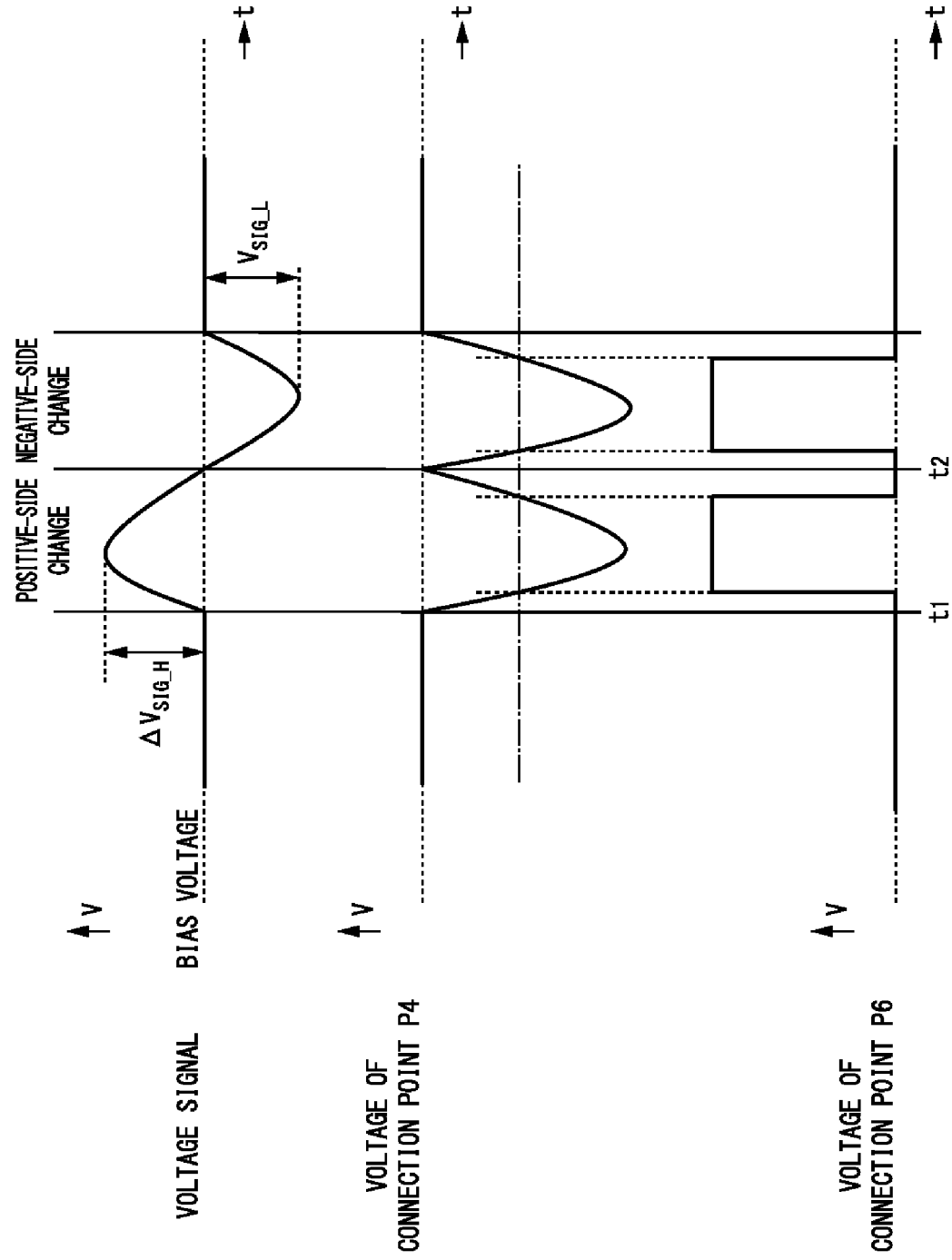
FIG. 2 is a waveform diagram showing detection of a voltage signal and a change in a voltage of an input terminal in a signal detection circuit.
Figure 3:
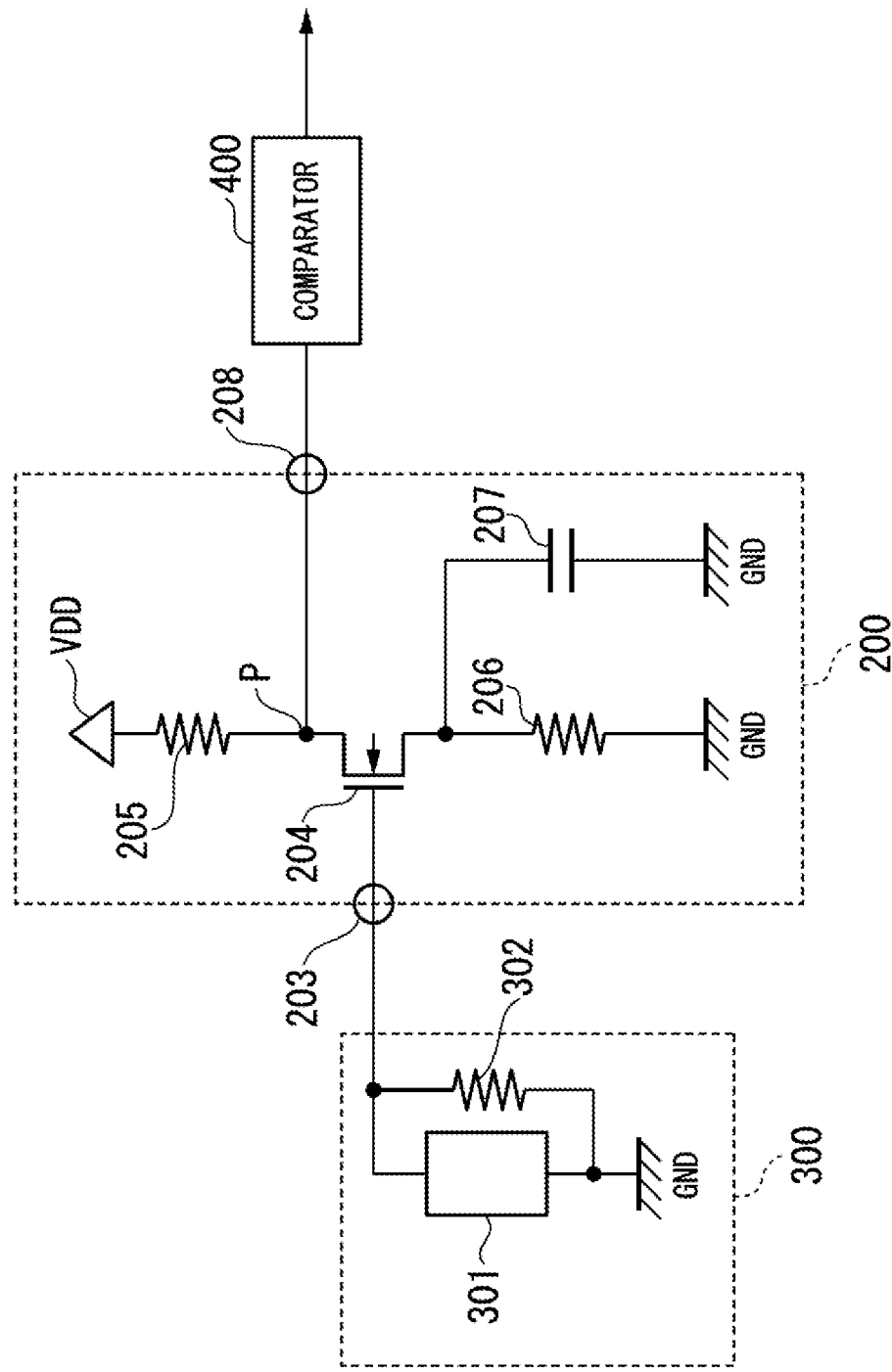
FIG. 3 is a conceptual diagram showing a configuration of a signal detection circuit that detects a change in a voltage detected by a pyroelectric infrared detection element.
Figure 4:
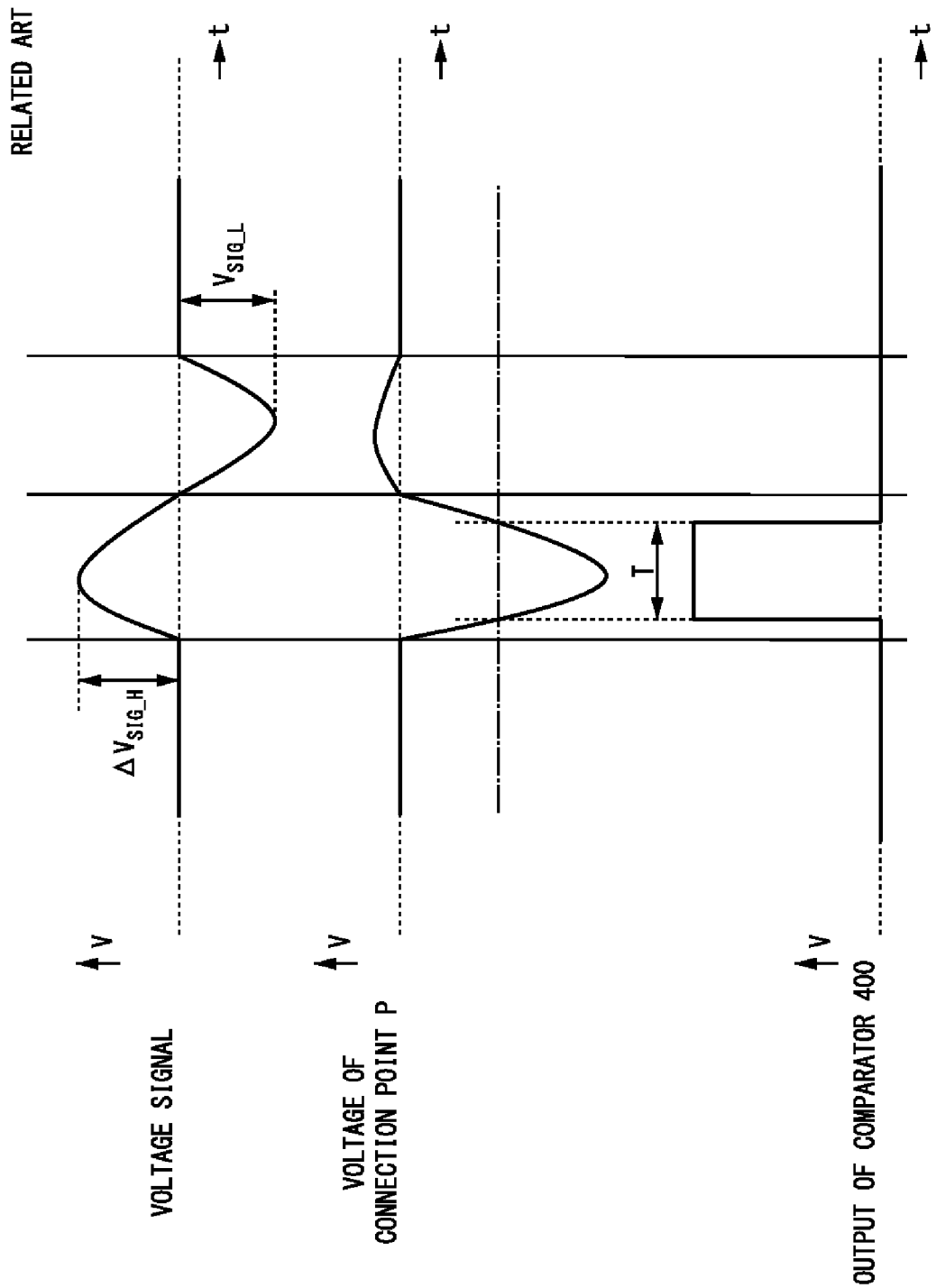
FIG. 4 is a waveform diagram showing detection of a change in a voltage signal and a voltage of an input terminal in the signal detection circuit shown in FIG. 3.

Next, an operation of the signal detection circuit 1 will be described. FIG. 2 is a waveform diagram showing detection of a voltage signal and a change in a voltage of the input terminal 101 in the signal detection circuit 1. In all the graphs in FIG. 2, the vertical axis represents a voltage value and the horizontal axis represents a time. An input voltage signal supplied to the input terminal, a voltage of the connection point P4, and a voltage of the connection point P6 are shown in order from the upper side.

At time t1, the voltage signal supplied to the input terminal 101 is changed by a voltage value $\Delta V_{SIG\_H}$ on the positive-side. Thus, the output bias voltage of the bias circuit 1A is changed on the positive-side.

Then, an amount of change of the bias voltage supplied to the negative-side change detection circuit 1B and the positive-side change detection circuit 1C to the positive-side is delivered.

In the pMOS transistor 107, the bias voltage is raised, and thus the VGS is lowered and the flowing drain current decreases.

Conversely, in the nMOS transistor 110, the bias voltage is raised, and thus the VGS is raised and the flowing drain current increases.

Thus, the drain current of the nMOS transistor 110 increases, and thus the voltage of the connection point P4 is lowered. At this time, the capacitor 112 is charged with the increased drain current. Thus, during a time corresponding to the capacitance of the capacitor 112, the VGS for the gate of the nMOS transistor 110 is maintained at the raised voltage value due to the change in the voltage signal on the positive-side.

Then, the voltage value of the connection point P4 is lowered, and thus the VGS of the pMOS transistor 114 is raised. Therefore, the drain current flowing in the pMOS transistor 114 increases, the voltage value of the connection point P6 is raised, and the output terminal 116 is brought to a power voltage (H level) of the VDD terminal.

Subsequently, charging of the capacitor 112 with the increased drain current of the nMOS transistor 110 progresses and the VGS of the nMOS transistor 110 is lowered, and thus the drain current of the nMOS transistor 110 decreases. Thus, the voltage of the connection point P4 is raised and the VGS of the pMOS transistor 114 is lowered. Then, the drain current flowing in the pMOS transistor 114 decreases, the voltage value of the connection point P6 is lowered, and the output terminal 116 enters a ground voltage (L level) of the GND terminal.

At time t2, the voltage signal supplied to the input terminal 101 is changed by a voltage value $\Delta V_{SIG\_L}$ on the negative-side. Thus, the output bias voltage of the bias circuit 1A is changed on the negative-side. Then, the amount of change in the bias voltage supplied to each of the negative-side change detection circuit 1B and the positive-side change detection circuit 1C to the negative-side is delivered.

In the nMOS transistor 110, the bias voltage is lowered, and thus the VGS is lowered and the flowing drain current decreases.

Conversely, in the pMOS transistor 107, the bias voltage is raised, and thus the VGS is raised and the flowing drain current increases.

Thus, the drain current of the pMOS transistor 107 increases, and thus the voltage of the connection point P2 is lowered. At this time, the capacitor 105 is charged with the increased drain current (a voltage difference between the terminals of the capacitor 105 increases). Thus, during a time corresponding to the capacitance of the capacitor 105, the VGS for the gate of the pMOS transistor 107 is maintained at the raised voltage value due to the change in the voltage signal on the negative-side.

Then, the drain current flowing in the pMOS transistor 107 increases, and thus the drain current flowing in the nMOS transistor 108 similarly increases. At this time, since the nMOS transistor 113 forms the current mirror circuit along with the nMOS transistor 108, the drain current of the nMOS transistor 108 is duplicated and flows.

Thus, the drain current of the nMOS transistor 113 increases and the voltage of the connection point P4 is lowered.

Then, the voltage value of the connection point P4 is lowered, and thus the VGS of the pMOS transistor 114 is raised. Therefore, the drain current flowing in the pMOS transistor 114 increases, the voltage value of the connection point P6 is raised, and the output terminal 116 enters the power voltage (H level) of the VDD terminal.

Subsequently, charging of the capacitor 105 with the increased drain current of the pMOS transistor 107 progresses and the VGS of the pMOS transistor 107 is lowered, and thus the drain current of the pMOS transistor 107 decreases. Then, the drain current flowing in the pMOS transistor 107 decreases, and thus the drain current flowing in the nMOS transistor 108 similarly decreases. At this time, since the drain current of the nMOS transistor 108 is duplicated and flows, the drain current of the nMOS transistor 113 also decreases and the voltage of the connection point P4 is raised.

The voltage of the connection point P4 is raised, and thus the VGS of the pMOS transistor 114 is lowered. Then, the drain current flowing in the pMOS transistor 114 decreases, the voltage value of the connection point P6 is lowered, and the output terminal 116 enters a ground voltage (L level) of the GND terminal.

As described above, according to the embodiment, it is possible to detect a change in the voltage of the voltage signal on the positive-side and the negative-side.

In the embodiment, the negative-side change detection circuit 1B and the positive-side change detection circuit 1C share the same circuit with the bias circuit 1A that has the function of the input circuit, but the negative-side change detection circuit 1B and the positive-side change detection circuit 1C may individually have a bias circuit. In this case, a circuit size increases, but an optimum bias voltage can be set in each of the negative-side change detection circuit 1B and the positive-side change detection circuit 1C.

In the embodiment, by realizing the configuration in which a similar drain current to that of the pMOS transistor 107 flows in the nMOS transistor 113, the NOR source-grounded amplification circuit is formed by the resistor 109, the nMOS transistor 110, and the nMOS transistor 113, and a similar drain current to the pMOS transistor 107 flows in the nMOS transistor 113, it is possible to obtain similar detection accuracy in detection of the change in the voltage of the voltage signal on each of the positive-side and the negative-side even if the characteristics (a threshold voltage or the like) of the nMOS transistor and the pMOS transistor vary in a process of manufacturing a semiconductor element.

Figure 5:
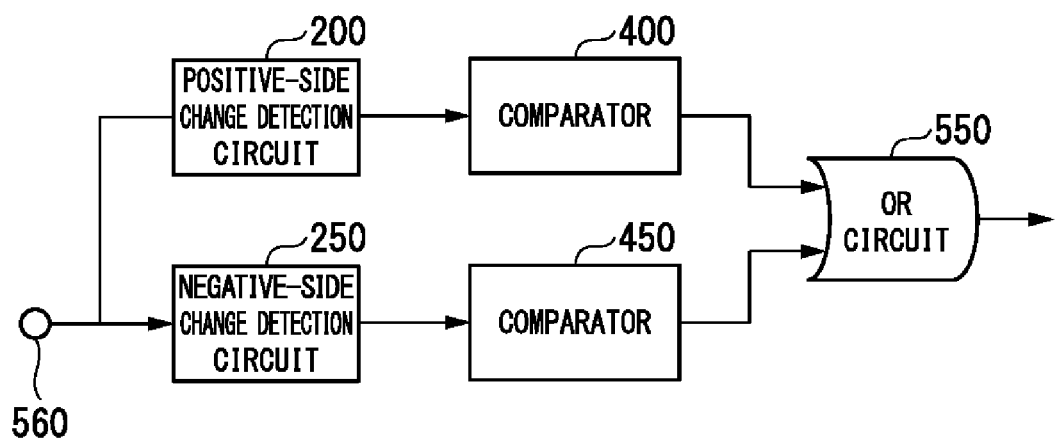
FIG. 5 is a diagram showing a configuration example of a circuit that detects a change in a voltage value of a voltage signal of a pyroelectric detection element on each of the positive-side and the negative-side.

In the embodiment, as described above, by configuring the NOR source-grounded amplification circuit and detecting a change in the voltage of the voltage signal on each of the positive-side and the negative-side by the same circuit and shaping the waveform of the signal of the detection result by the same output circuit 1E, it is possible to decrease the circuit size and reduce current consumption compared to a signal detection circuit that includes an amplification circuit in each of a positive-side change detection circuit and a negative-side change detection circuit on the basis of a signal detection circuit of the related art and is configured so that a waveform of each output is shaped by a different comparator, as shown in FIG. 5.

One of the constant current source circuits in which a current limitation resistor, a current limitation diode, a MOS transistor, or the like is used may be used for each of the constant current source circuits 106, 111, and 115 described above.

In the embodiment, the current mirror circuit formed by the nMOS transistors 108 and 113 is used to control the VGS of the nMOS transistor 113, but the nMOS transistor 108 may be replaced with a current limitation resistor.

While preferred embodiments of the invention have been described in detail with reference to the drawings, specific configurations are not to be considered as limiting to the embodiments, but also include designs without departing from the spirit or scope of the present invention.

What is claimed is:

1. A signal detection circuit comprising:
a power terminal;
a first current limitation circuit connected to the power terminal;
a second current limitation circuit;
a resistor connected to the power terminal;

a current-voltage conversion circuit;
a first p-channel MOS transistor including a source connected to the power terminal via the first current limitation circuit, a gate to which a voltage changing in accordance with a change in a voltage level of an input voltage is supplied, and a drain grounded via the current-voltage conversion circuit;
a first n-channel MOS transistor including a drain connected to the power terminal via the resistor, a gate to which the voltage changing in accordance with the change in the voltage level of the input voltage is supplied, and a source grounded via the second current limitation circuit; and
a second n-channel MOS transistor in which a drain is connected to a first connection point connecting the resistor with the drain of the first n-channel MOS transistor, a gate is connected to a second connection point connecting the drain of the first p-channel MOS transistor with the current-voltage conversion circuit, and a source is grounded.

2. The signal detection circuit according to claim 1,
wherein the first current limitation circuit includes a first constant current source circuit and a first capacitor connected in parallel, and
wherein the second current limitation circuit includes a second constant current source circuit and a second capacitor connected in parallel.

3. The signal detection circuit according to claim 2,
wherein the current-voltage conversion circuit includes a third n-channel MOS transistor in which each of a gate and a drain are connected to the drain of the first p-channel MOS transistor and the gate of the second n-channel MOS transistor, and a source is grounded.

4. The signal detection circuit according to claim 3, further comprising:
a third current limitation circuit; and
a second p-channel MOS transistor in which a source is connected to the power terminal, a gate is connected to the first connection point, and a drain is grounded via the third current limitation circuit.

5. The signal detection circuit according to claim 2, further comprising:
a third current limitation circuit; and
a second p-channel MOS transistor in which a source is connected to the power terminal, a gate is connected to the first connection point, and a drain is grounded via the third current limitation circuit.

6. The signal detection circuit according to claim 1,
wherein the current-voltage conversion circuit includes a third n-channel MOS transistor in which each of a gate and a drain are connected to the drain of the first p-channel MOS transistor and the gate of the second n-channel MOS transistor, and a source is grounded.

7. The signal detection circuit according to claim 3, further comprising:
a third current limitation circuit; and
a second p-channel MOS transistor in which a source is connected to the power terminal, a gate is connected to the first connection point, and a drain is grounded via the third current limitation circuit.

8. The signal detection circuit according to claim 1, further comprising:
a third current limitation circuit; and
a second p-channel MOS transistor in which a source is connected to the power terminal, a gate is connected to the first connection point, and a drain is grounded via the third current limitation circuit.

9. A signal detection method, using a signal detection circuit including a power terminal, an input terminal, a first current limitation circuit connected to the power terminal, a second current limitation circuit, a resistor connected to the power terminal, a current-voltage conversion circuit, a first p-channel MOS transistor including a source connected to the power terminal via the first current limitation circuit, a gate to which a voltage changing in accordance with a change in a voltage level of an input voltage is supplied, and a drain grounded via a current-voltage conversion circuit, a first n-channel MOS transistor including a drain connected to the power terminal via the resistor, a gate to which a voltage changing in accordance with the change in the voltage level of the input voltage is supplied, and a source grounded via the second current limitation circuit, and a second n-channel MOS transistor in which a drain is connected to a first connection point connecting the resistor with the drain of the first n-channel MOS transistor, a gate is connected to a second connection point connecting the drain of the first p-channel MOS transistor with the current-voltage conversion circuit, and a source is grounded, comprising of:
amplifying a change in a signal voltage supplied from the input terminal to a positive voltage side by the resistor and the first n-channel MOS transistor; and
amplifying a change in a signal voltage supplied from the input terminal to a negative voltage side by the resistor and the second n-channel MOS transistor.

10. The signal detection method according to claim 9,
wherein the first current limitation circuit includes a first current limitation circuit and a first capacitor connected in parallel, and
wherein the second current limitation circuit includes a second current limitation circuit and a second capacitor connected in parallel.

* * * * *

UNITED STATES PATENT AND TRADEMARK OFFICE
CERTIFICATE OF CORRECTION

PATENT NO. : 10,794,770 B2
APPLICATION NO. : 16/277215
DATED : October 6, 2020
INVENTOR(S) : Fumiyasu Utsunomiya et al.

It is certified that error appears in the above-identified patent and that said Letters Patent is hereby corrected as shown below:

In the Claims

In Column 10, Claim 7, Line 3, delete "claim 3" and replace with -- claim 6 --.

Signed and Sealed this
Eighth Day of December, 2020

Andrei Iancu
*Director of the United States Patent and Trademark Office*